(12) United States Patent
Wang et al.

(10) Patent No.: US 11,239,992 B1
(45) Date of Patent: Feb. 1, 2022

(54) EFFICIENT PHASE CALIBRATION METHODS AND SYSTEMS FOR SERIAL INTERFACES

(71) Applicant: Samsung Display Co., Ltd., Yongin-si (KR)

(72) Inventors: Michael Wang, San Jose, CA (US); Kyunglok Kim, Belmont, CA (US)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/211,758

(22) Filed: Mar. 24, 2021

Related U.S. Application Data

(60) Provisional application No. 63/135,434, filed on Jan. 8, 2021.

(51) Int. Cl.
| | |
|---|---|
| *H03D 3/24* | (2006.01) |
| *H04L 7/02* | (2006.01) |
| *H04B 17/12* | (2015.01) |
| *H04B 17/21* | (2015.01) |
| *H03L 7/081* | (2006.01) |

(52) U.S. Cl.
CPC .............. *H04L 7/02* (2013.01); *H03L 7/0814* (2013.01); *H04B 17/12* (2015.01); *H04B 17/21* (2015.01)

(58) Field of Classification Search
CPC ......... H04L 7/02; H04L 25/062; H04B 17/12; H04B 17/21; H03L 7/0814; H03L 7/085; H03L 7/093; H03L 7/081; G06F 1/04; G06F 1/3296; H04J 3/047; H03K 19/21

USPC ................................ 375/373–376, 326, 327
See application file for complete search history.

(56) References Cited

U.S. PATENT DOCUMENTS

| | | | | |
|---|---|---|---|---|
| 6,621,861 | B1* | 9/2003 | Shen ..................... | H04L 25/062 375/226 |
| 7,644,296 | B1* | 1/2010 | Burney ................... | H04J 3/047 713/401 |
| 8,594,264 | B1 | 11/2013 | Zhu et al. | |
| 9,442,512 | B1* | 9/2016 | Coteus ................. | G06F 1/3296 |
| 10,277,431 | B2* | 4/2019 | Tajalli .................... | H03K 19/21 |
| 10,367,636 | B2 | 7/2019 | Aleksic et al. | |
| 10,686,582 | B1* | 6/2020 | Pasdast ................... | H03L 7/093 |
| 10,797,683 | B1 | 10/2020 | Jain et al. | |
| 11,003,203 | B2* | 5/2021 | Poon ......................... | G06F 1/04 |
| 11,056,158 | B2* | 7/2021 | Kang ...................... | H03L 7/085 |
| 2019/0173661 | A1* | 6/2019 | Aleksic .................. | H03L 7/081 |

* cited by examiner

*Primary Examiner* — Phuong Phu
(74) *Attorney, Agent, or Firm* — Lewis Roca Rothgerber Christie LLP

(57) ABSTRACT

A phase calibration method includes sweeping phase codes applicable to a serial clock signal, identifying a first, a second, a third, and a fourth phase code, wherein the first phase code causes zero plus a first threshold number of bits extracted from the serial data signal to be a particular value, wherein the second phase code causes all minus a second threshold number of bits extracted from the serial data signal to be the particular value, wherein the third phase code causes all minus a third threshold number of bits extracted from the serial data signal to be the particular value, wherein the fourth phase code causes zero plus a fourth threshold number of bits extracted from the serial data signal to be the particular value, determining an average phase code based on the identified phase codes.

20 Claims, 8 Drawing Sheets

CLOCK EDGE IN THE MIDDLE OF THE DATA EYE 122

CLOCK EDGE NOT IN THE MIDDLE OF THE DATA EYE 124

CLOCK EDGE IN THE MIDDLE OF THE DATA EYE 126

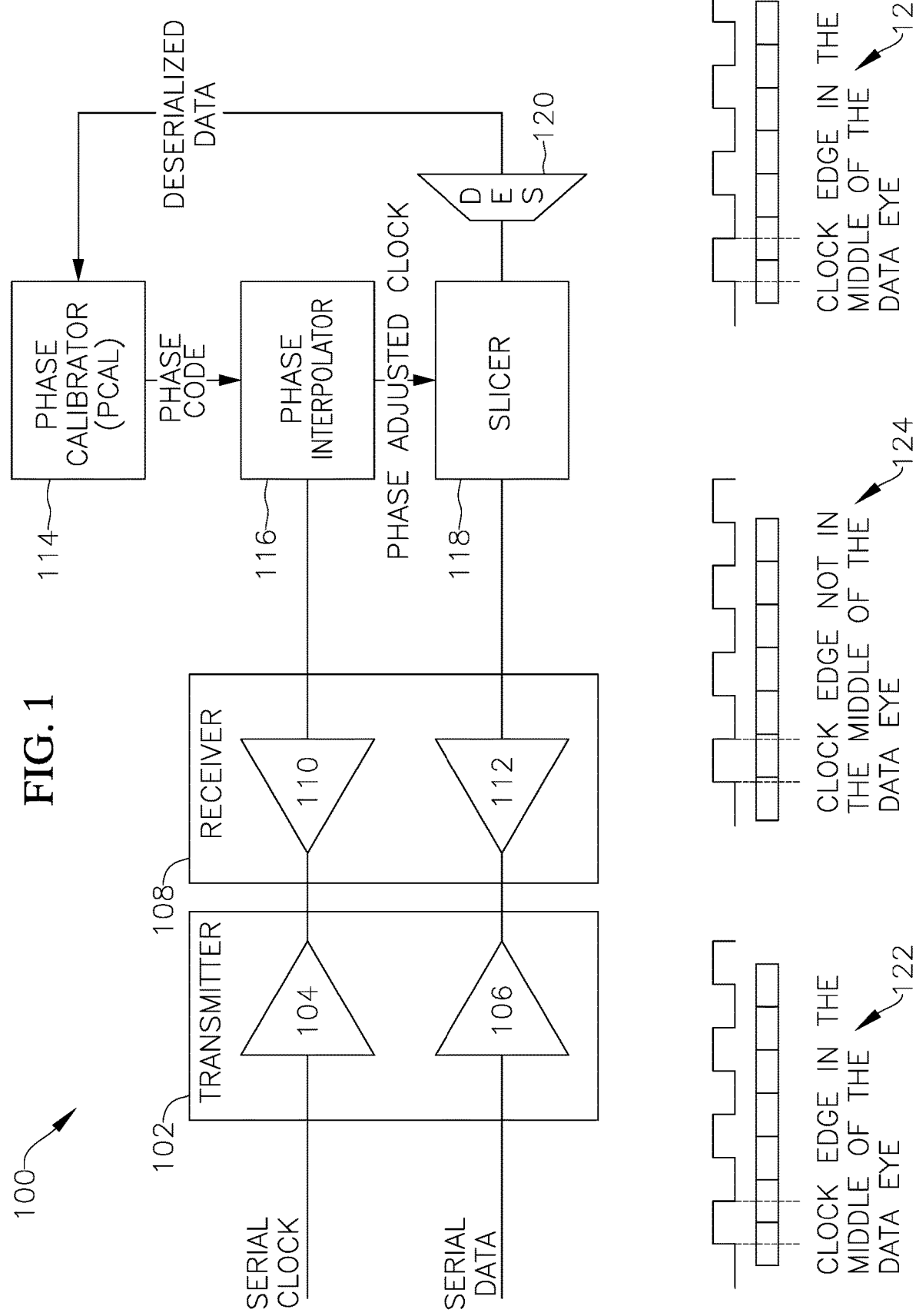

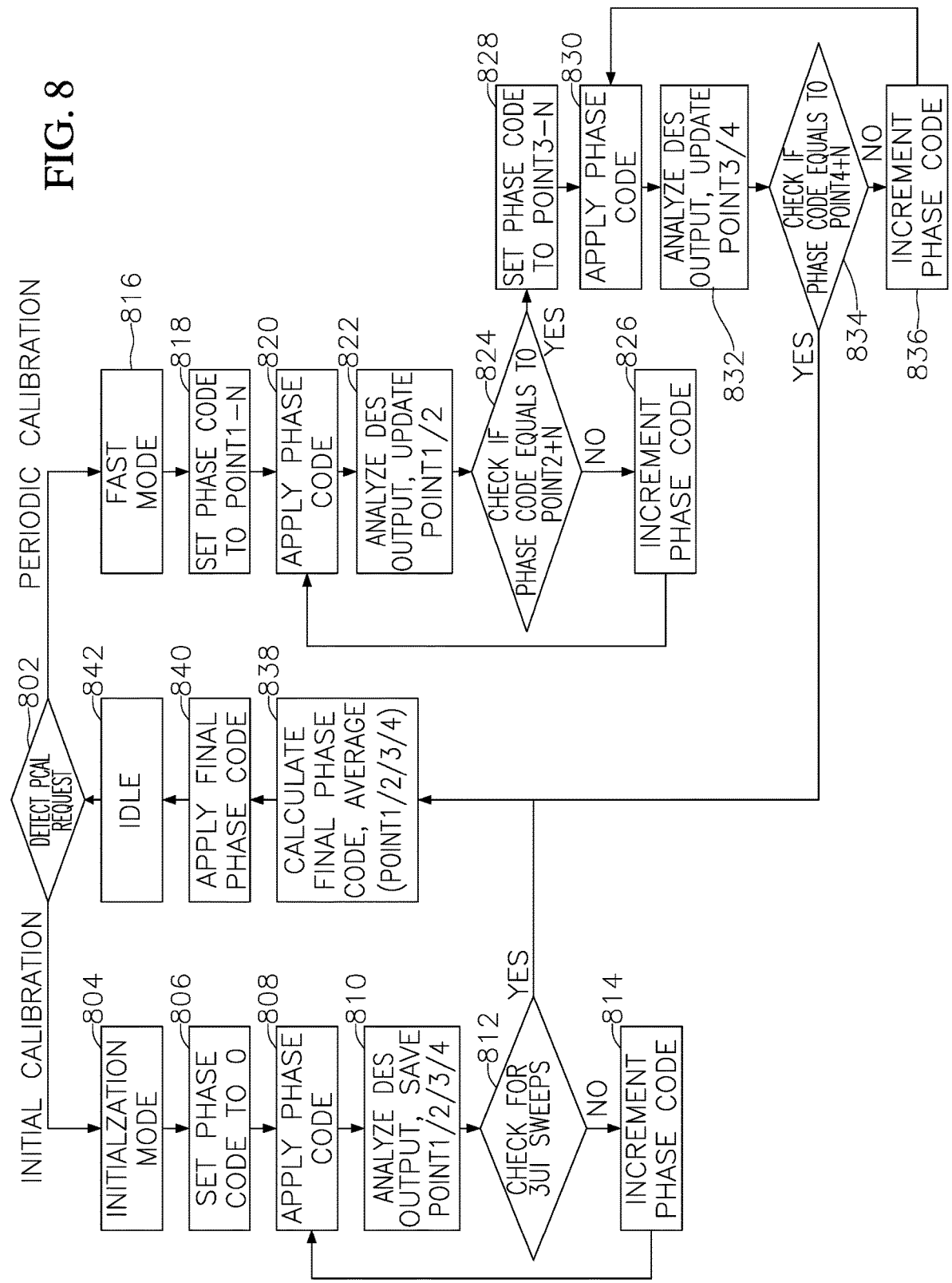

EFFICIENT PHASE CALIBRATION METHODS AND SYSTEMS FOR SERIAL INTERFACES

CROSS-REFERENCE TO RELATED APPLICATION

This application claims priority to U.S. Provisional Patent Application No. 63/135,434 filed on Jan. 8, 2021, which is incorporated herein by reference in its entirety.

FIELD

The present application generally relates to phase calibration techniques, and more particularly to efficient phase calibration methods and systems for serial interfaces.

BACKGROUND

Transferring data over high-speed serial interfaces rely on clock signals to be calibrated with the data that is being sent over the interface. Uncalibrated clock signals may sometimes result in receiving unreliable, error prone data. Therefore, techniques for efficiently calibrating clock signals are desired.

SUMMARY

According to an embodiment, a phase calibration method is described. The method may include: receiving a serial clock signal; receiving a serial data signal; sweeping a plurality of phase codes applicable to the serial clock signal to shift a phase of the serial clock signal; identifying a first phase code out of the plurality of phase codes, wherein the first phase code causes zero plus a first threshold number of bits extracted from the serial data signal to be a particular value; identifying a second phase code out of the plurality of phase codes, wherein the second phase code causes all minus a second threshold number of bits extracted from the serial data signal to be the particular value; identifying a third phase code out of the plurality of phase codes, wherein the third phase code causes all minus a third threshold number of bits extracted from the serial data signal to be the particular value; identifying a fourth phase code out of the plurality of phase codes, wherein the fourth phase code causes zero plus a fourth threshold number of bits extracted from the serial data signal to be the particular value; determining an average phase code based on the first phase code, the second phase code, the third phase code, and the fourth phase code; and applying the average phase code to a phase interpolator to shift the phase of the serial clock signal.

The serial data signal may include a training pattern that is the same as the serial clock signal, and each of the first, second, third, and fourth threshold number of bits may correspond to about 0% to about 5% of total bits extracted.

The particular value may include ones or zeros, wherein the ones may include bits that are extracted from the serial data signal at points that are earlier than intended, and wherein the zeros may include bits that are extracted from the serial data signal at points that are later than intended.

The sweeping the plurality of phase codes may include sweeping three unit intervals of the serial data.

The applying the average phase code to the phase interpolator to shift the phase of the serial clock signal may include shifting the serial clock signal such that an edge of the serial clock signal is aligned with middle of data eye of the serial data signal.

The extracted bits from the serial data signal may include a first bit corresponding to a rising edge of the serial clock signal and a second bit corresponding to a falling edge of the serial clock signal.

The method may further include: sweeping a first window of phase codes to identify an updated first phase code and an updated second phase code, wherein the first window begins at the first phase code minus a constant and ends at the second phase code plus the constant; sweeping a second windows of phase codes to identify an updated third phase code and an updated fourth phase code, wherein the second windows begins at the third phase code minus the constant and ends at the fourth phase code plus the constant; determining an updated average phase code based on the updated first phase code, the updated second phase code, the updated third phase code, and the updated fourth phase code; and applying the updated average phase code to the phase interpolator to further shift the serial clock signal.

The constant may be a predetermined value that is programmable.

The updated first phase code may be different from the updated second phase code, and the updated third phase code is different from the updated fourth phase code.

According to another embodiment a system is described. The system may include: a memory storing computer-executable instructions; and a processor configured to execute the instructions and causes the system to perform operations comprising: receiving a serial clock signal; receiving a serial data signal; sweeping a plurality of phase codes applicable to the serial clock signal to shift a phase of the serial clock signal; identifying a first phase code out of the plurality of phase codes, wherein the first phase code causes zero plus a first threshold number of bits extracted from the serial data signal to be a particular value; identifying a second phase code out of the plurality of phase codes, wherein the second phase code causes all minus a second threshold number of bits extracted from the serial data signal to be the particular value; identifying a third phase code out of the plurality of phase codes, wherein the third phase code causes all minus a third threshold number of bits extracted from the serial data signal to be the particular value; identifying a fourth phase code out of the plurality of phase codes, wherein the fourth phase code causes zero plus a first threshold number of bits extracted from the serial data signal to be the particular value; determining an average phase code based on the first phase code, the second phase code, the third phase code, and the fourth phase code; and applying the average phase code to a phase interpolator to shift the phase of the serial clock signal.

The system of may include further instructions that causes the system to perform operations including: sweeping a first window of phase codes to identify an updated first phase code and an updated second phase code, wherein the first window begins at the first phase code minus a constant and ends at the second phase code plus the constant; sweeping a second windows of phase codes to identify an updated third phase code and an updated fourth phase code, wherein the second windows begins at the third phase code minus the constant and ends at the fourth phase code plus the constant; determining an updated average phase code based on the updated first phase code, the updated second phase code, the updated third phase code, and the updated fourth phase code; and applying the updated average phase code to the phase interpolator to further shift the serial clock signal.

According to another embodiment, a phase calibration method may be described. The method may include: receiving a serial clock signal; receiving a serial data signal;

sweeping a first window of phase codes, applicable to the serial clock signal to shift a phase of the serial clock signal, to identify an updated first phase code and an updated second phase code, wherein the first window begins at a predetermined first phase code minus a constant and ends at a predetermined second phase code plus the constant; identifying the updated first phase code, wherein the updated first phase code causes zero plus a first threshold number of bits extracted from the serial data signal to be a particular value; identifying the updated second phase code, wherein the updated second phase code causes all minus a second threshold number of bits extracted from the serial data signal to be the particular value; sweeping a second window of phase codes, applicable to the serial clock signal to shift the phase of the serial clock signal, to identify an updated third phase code and an updated fourth phase code, wherein the second window begins at a predetermined third phase code minus the constant and ends at a predetermined fourth phase code plus the constant; identifying the updated third phase code, wherein the updated third phase code causes all minus a third threshold number of bits extracted from the serial data signal to be the particular value; identifying the updated fourth phase code, wherein the updated fourth phase code causes zero plus a fourth threshold number of bits extracted from the serial data signal to be the particular value; determining an average phase code based on the updated first phase code, the updated second phase code, the updated third phase code, and the updated fourth phase code; and applying the average phase code to a phase interpolator to shift the phase of the serial clock signal.

The scope of the invention is defined by the claims, which are incorporated into this section by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

FIG. 1 illustrates an electronic device having a serial interface with an example block diagram of a phase calibration circuit, according to an embodiment.

FIG. 8 is a flow chart illustrating methods for phase calibration, according to various embodiments.

Figure 2A:
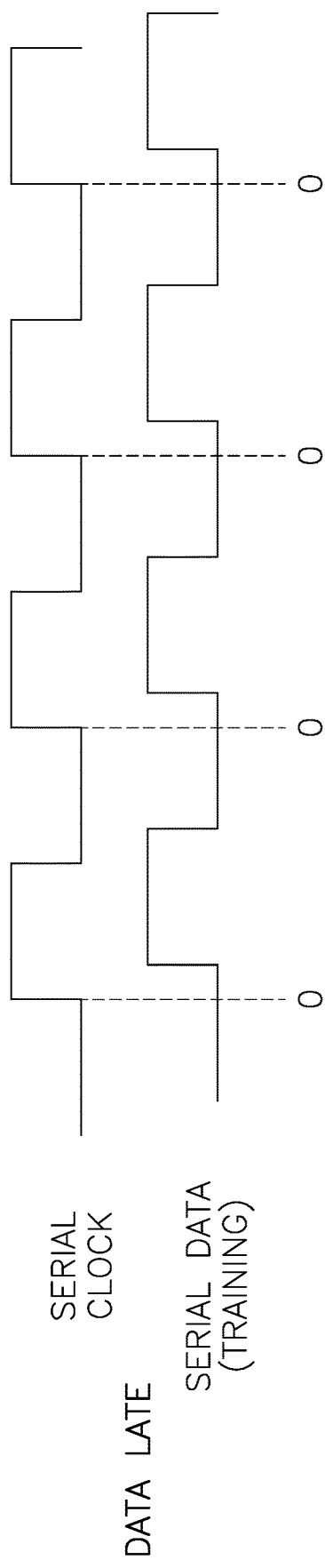
FIGS. 2A-2B illustrate serial clock signals and serial data signals where the data is sampled at the rising edge of the clock signal, according to an embodiment.

Embodiments of the present disclosure and their advantages are best understood by referring to the detailed description that follows. Unless otherwise noted, like reference numerals denote like elements throughout the attached drawings and the written description, and thus, descriptions thereof will not be repeated. In the drawings, the relative sizes of elements, layers, and regions may be exaggerated for clarity.

DETAILED DESCRIPTION

Hereinafter, example embodiments will be described in more detail with reference to the accompanying drawings. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described.

Embodiments of the present disclosure relate to devices that use high-speed serial data interfaces to transfer data from one device to another. One example of the high-speed serial data interface may be a mobile display interface such as MIPI D-PHY that transfers video and/or audio data from one device to another device. Other examples of high-speed serial data interfaces may include DDR interfaces or other high-speed serial data interfaces known to those skilled in the art. More generally, the embodiments of the present disclosure relate to phase calibration techniques in forwarded-clock PHY protocols to adjust the phase of the forwarded clock to ensure data is sampled correctly.

FIG. 1 illustrates an electronic device with a serial interface and an example block diagram of a phase calibration circuit, according to embodiments of the present disclosure.

According to an embodiment, a transmitter 102 is configured to send data to a receiver 108 that is coupled together over a high-speed serial data interface, such as a MIPI D-PHY interface. For example, the transmitter 102 may be a computer tablet and the receiver 108 may be a display device, and the computer tablet may be configured to send video data to the display device to be displayed. In some embodiments, the transmitter 102 includes at least a clock transmitter 104 and a data transmitter 106, and the receiver 108 includes at least a clock receiver 110 and a data receiver 112. The clock transmitter 104 is configured to transmit a serial clock signal which is received by the clock receiver 110, and the data transmitter 106 is configured to transmit a serial data signal which is received by the data receiver 112. Accordingly, a slicer (or sampler) 118 coupled to the receiver is configured to sample the received serial data signal based on the received clock signal, for example, at every rising edge of the clock signal.

In some embodiments, the transmitter 102 and the receiver 108 may be part of the same electronic device or system. For example, the transmitter 102 and the receiver 108 may both be within the display device connected via the high-speed serial interface. In other embodiments, the transmitter 102 and the receiver 108 may both be within a single computer connected via the high-speed serial interface, and configured to transfer data from one area of the computer to another area.

According to an embodiment as illustrated in FIG. 1, a periodic square wave clock signal is transmitted by the clock transmitter 104 and the data signal is transmitted by the data transmitter 106. Here, the clock signal and the data signal are transmitted such that the edges (e.g., rising edge or falling edge) of the clock signal aligns with the middle of the data eye as illustrated at 122 in FIG. 1. This alignment is desirable because the data signal is sampled by the slicer 118 by using an edge of the clock signal, for example, the rising edge of the clock signal. By aligning the edge of the clock signal and with the middle of the data eye, it assures that the correct data is sampled. That is, if the data is a logic 1, then a logic 1 is sampled, and if the data is a logic 0, then a logic 0 is sampled because the clock edge is in the middle of the data eye where the data does not change from a 1 to a 0 or from a 0 to a 1.

As the clock signal and the data signal are transmitted to a receiver over the high-speed serial interface, the phase of the clock signal may be shifted (e.g., relative to the data signal). In some instances, the phase of the clock signal may shift such that the edge of the clock signal becomes aligned or approximately aligned with the edge of the data signal as illustrated at 124 in FIG. 1. When this happens and the slicer 118 samples the data signal at, for example, the rising edge of the clock signal, but the sampler may not extract an accurate sample of the data because the clock signal and the data signal are no longer aligned. That is, the sampled data may be extracted as a logic 1 or a logic 0 depending on whether the data signal is sampled slightly earlier or slightly later. Thus, it is desirable to calibrate the phase shift in a phase calibration process so that the edges of the received clock signal aligns with the middle of the data eye of the data signal as originally transmitted by the transmitter 102. Accordingly, by performing the phase calibration, the clock signal and the data signal may be properly aligned as illustrated at 126 in FIG. 1. In some embodiments, the phase calibration may be performed initially when the system or devices are turned on. In other embodiments, the phase calibration may be performed periodically or at some regular interval during operation (e.g., when there is a pause in data transmission) by sending calibration data or training data. Yet in other embodiments, a combination of initial phase calibration and periodic phase calibration may be performed to further reinforce a properly calibrated serial interface.

According to an embodiment, a phase interpolator 116 is coupled to the serial clock receiver 108 and is configured to receive a phase shifted clock signal. The slicer 118 is coupled to the data receiver 112 and is configured to receive the data signal. The phase shifted clock signal is sent from the phase interpolator 116 to the slicer 118, and the slicer 118 samples the received serial data based on this phase shifted clock signal. Thus, the embodiments of the present disclosure provide techniques for phase calibrating the phase shifted clock signal so that the phase interpolator 116 may provide a phase adjusted (or phase calibrated) clock signal to the slicer 118 so that the slicer 118 may correctly sample data. In some embodiments, a training data signal that is the same or substantially the same signal as the serial clock signal, comprising alternating zeros and ones, may be provided to the slicer 118 to perform the phase calibration.

According to an embodiment, the sampled data from the slicer 118 is provided to a deserializer 120 which deserializes the serial data signal and provides the deserialized data to a phase calibrator 114. In some embodiment, the deserialized data may be a block of 16 bits of data, yet in other embodiments, the deserialized data may be a block of 32, 64, or any predefined number of bits of data. The phase calibrator 114 then takes the deserialized data and performs a phase calibration process to determine a phase code, which will be provided to and used by the phase interpolator 116 to adjust the phase shifted clock signal.

Figure 2B:
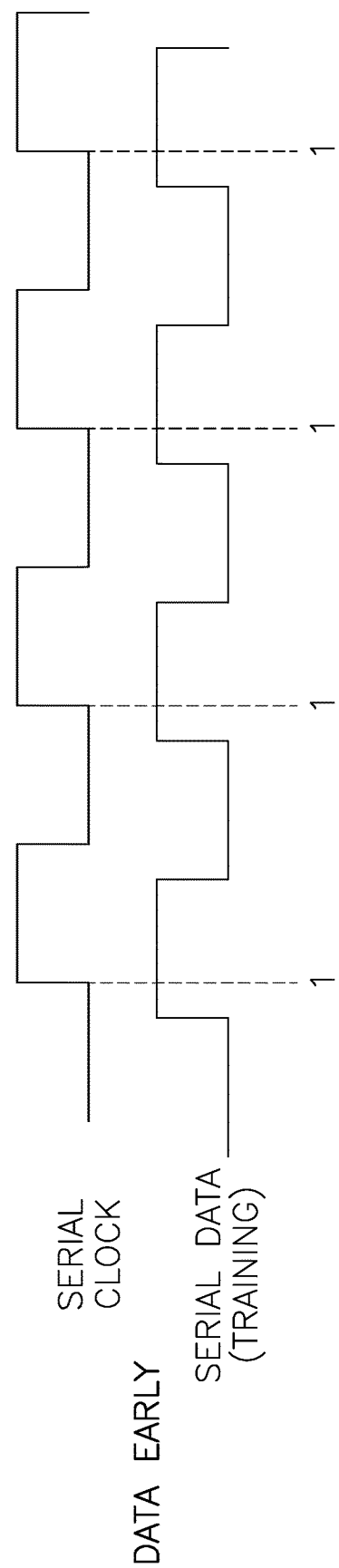

FIGS. 2A-2B illustrate a case where the clock signal has moved or shifted due to, for example, external factors such as interferences from cables, connections, etc. More in particular, FIG. 2A illustrates a serial clock signal and a serial data signal where the serial clock signal has moved to the right relative to a clock signal that is properly calibrated. Here, a properly calibrated clock signal is one where the rising edge of the clock signal is aligned with the center of the data eye (e.g., center of the zeros) of the data signal as illustrated at 122 in FIG. 1, and therefore, the clock signal in FIG. 2A is shown to have moved to the right because the rising edge is aligned away from the center of the zeros of the data signal and closer toward the rising edge of the data signal. Accordingly, the data signal lags the clock signal and the slicer 118 may sample the data signal at points that are later than intended with a properly calibrated clock signal, which is referred to herein the present disclosure as "late bits." In other words, the data signal is sampled closer to the rising edge of the data signal instead of toward the center of the data eye of the data signal during the rising edge of the clock signal.

FIG. 2B illustrates a serial clock signal and a serial data signal where the serial clock signal has moved to the left relative to a clock signal that is properly calibrated. Here, a properly calibrated clock signal is one where the rising edge of the clock signal is aligned with the center of the data eye (e.g., center of the ones) of the data signal as illustrated at 122 in FIG. 1, and therefore, the clock signal in FIG. 2B is shown to have moved to the left because the rising edge is aligned away from the center of the ones of the data signal and closer toward the rising edge of the data signal. Accordingly, the data signal leads the clock signal and the slicer 118 may sample the data signal at points that are earlier than intended with a properly calibrated clock signal, which may be referred to herein the present disclosure as "early bits." In other words, the data signal is sampled closer to the rising edge of the data signal instead of toward the center of the data eye of the data signal during the rising edge of the clock signal. A late or a lagging data signal, as depicted in FIG. 2A, or an early or a leading data signal, as depicted in FIG. 2B, may result in the slicer 118 generating incorrect data, particularly if the data is sampled too close to the edges of the data signal. Therefore, the clock signal may be phase calibrated by shifting the clock signal in FIG. 2A to the left such that the edges of the clock signal aligns with the middle of the data eye of the data signal, and the clock signal in FIG. 2B may be phase calibrated by shifting the clock signal to the right such that the edge of the clock signal aligns with the middle of the data eye of the data signal.

In some embodiments, the data may be sampled at the rising edge of the clock signal and if the sampled data is all or mostly all zeros as illustrated in FIG. 2A, then the phase calibrator may determine that the data signal lags the clock signal, and therefore the data signal is sampled at a later time than intended. On the other hand, if the sampled data is all or mostly all ones as in FIG. 2B, then the phase calibrator 114 may determine that the data signal leads the clock signal, and therefore the data signal is sampled at an earlier time than intended. Moreover, in some embodiment, sampled data that is all or mostly zeros may instead indicate that the data signal is sampled earlier (instead of later) because a different data signal pattern may be used and/or the data may be sampled at the falling edges of the clock signals. Similarly, sampled data that is all or mostly ones may instead indicate that the data signal is sampled later (instead of earlier) for the same reasons. Accordingly, the phase calibrator 114 may look for all or mostly all zeros, or all or mostly all ones so that an appropriate phase code may be applied to the clock signal to shift the edge of the clock signal to align with the middle of the data eye of the data signal.

Figure 3A:
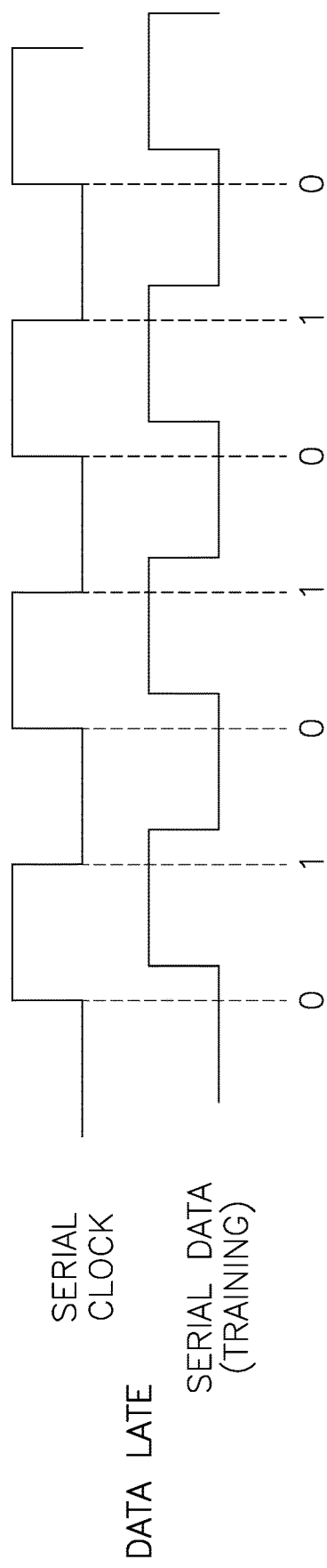
FIGS. 3A-3B illustrate serial clock signals and serial data signals where the data is sampled at the both the rising edge and the falling edge of the clock signal according to an embodiment.

Similar to FIG. 2A, FIG. 3A illustrates a serial clock signal and a serial data signal where the clock signal has moved to the right relative to a clock signal that is properly calibrated. Here, a properly calibrated clock signal is one where the rising edge of the clock signal is aligned with the center of the data eye of the zeros of the data signal, and the falling edge of the clock signal is aligned with the center of the data eye of the ones of the data signal, and therefore, the clock signal in FIG. 3A is shown to have moved to the right because the rising edge is aligned away from the center of the data eye of zeros of the data signal and closer toward the rising edge of the data signal, and the falling edge is aligned away from the center of the eye of ones of the data signal and closer toward the falling edge of the data signal. Accordingly, the data signal lags the clock signal and the slicer 118 may sample the data signal at points that are later than intended.

Figure 3B:
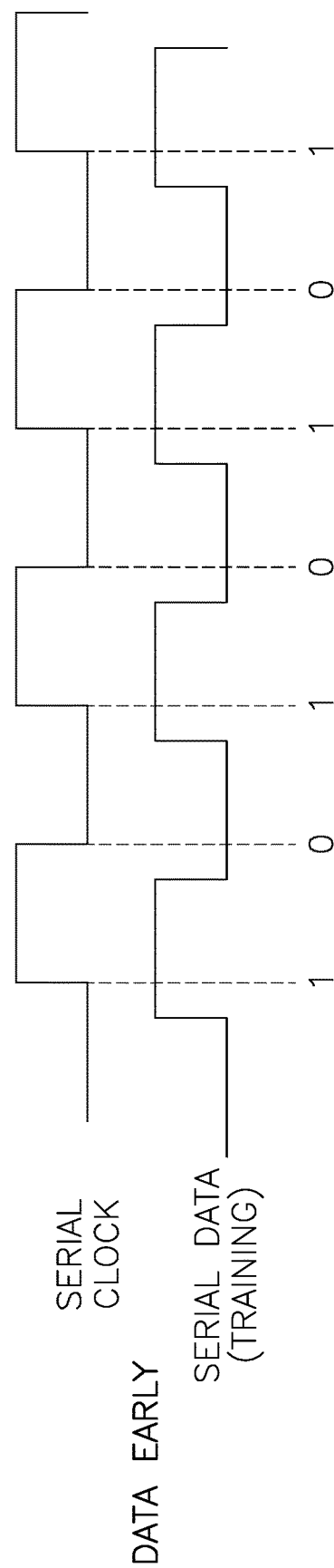

Similar to FIG. 2B, FIG. 3B illustrates a serial clock signal and a serial data signal where the clock signal has moved to the left relative to a clock signal that is properly calibrated. Here, a properly calibrated clock signal is one where the rising edge of the clock signal is aligned with the center of the data eye of the ones of the data signal, and the falling edge of the clock signal is aligned with the center of the data eye of the zeros of the data signal. Therefore, the clock signal in FIG. 3B is shown to have moved to the left because the rising edge is aligned away from the center of the data eye of ones of the data signal and closer toward the rising edge of the data signal, and the falling edge is aligned away from the center of the eye of zeros of the data signal and closer toward the falling edge of the data signal. Accordingly, the data signal leads the clock signal and the slicer 118 may sample the data signal at points that are earlier than intended. However, differently from FIGS. 2A-2B, FIGS. 3A-3B illustrate data sampling techniques where the data is sampled at both the rising edge and the falling edge of the serial clock signal. For example, referring to FIG. 3A, if all of the even bits of the sampled data are zeros and all of the odd bits of the sampled data are ones, then the phase calibrator 114 may determine that the data signal lags the clock signal, according to an embodiment. On the other hand, if all of the even bits of the sampled data are ones and all of the even bits of the sampled data are zeros, then the phase calibrator 114 may determine that the data signal leads the clock signal, according to an embodiment.

In some embodiments, the phase calibrator 114 may set a phase code depending on whether the data is being sampled early or late, so that the phase shift of the clock signal may be adjusted such that the edges of the clock signal will align with the middle of the data eye of the data signal. A phase code may be, for example, a numerical value represented by 8-bits, i.e., 0-255, corresponding to 256 different incremental shifts to the clock signal. Accordingly, when a phase code is applied to the phase interpolator 116, the phase interpolator 116 may shift the phase of the clock signal by an amount that is associated with the given phase code. For example, a phase code of 1 may correspond to a 1.4 degrees phase shift to the clock signal. Therefore, when the phase code of 1 is applied to the phase interpolator 116, the phase interpolator 116 may shift or offset the clock signal by 1.4 degrees. In another example, a phase code of 37 may correspond to a phase shift of 52 degree to the clock signal. Therefore, when the phase code of 37 is applied to the phase interpolator 116, the phase interpolator 116 may shift or offset the clock signal by 52 degrees. Thus, the phase interpolator 116 may offset, and thereby adjust the phase of the clock signal based on the phase code that is provided to the phase interpolator 116. Accordingly, the phase adjusted clock signal may be used to sample the serial data signal by the slicer 118, and the sampled data may be deserialized 120 and then analyzed by the phase calibrator 114 to determine whether the clock signal is adjusted as desired. In one embodiment, the desired outcome is when the clock signal is calibrated such that the rising edge of the clock signal is aligned with the center of the data eye of the data signal. Accordingly, different phase codes may be applied to the phase interpolator 116 until the desired phase shifted clock signal is achieved through trial and error.

By sampling the data at both the rising edge and the falling edge of the clock signal, for example in a DDR-based seral link where one clock cycle is equivalent to two unit intervals, the data signal may be sampled faster (i.e., at twice the speed) than sampling the data at just the rising edge or just the falling edge of the clock signal (e.g., a given number of bits may be sampled from the data signal in half the number of clock cycles compared to sampling only on falling edges or only rising edges). Because phase calibration algorithms may depend on sampling a particular number of bits, by sampling the data at a faster speed, the phase code may be determined and set at a faster speed and the phase shifted clock signal may be adjusted faster, thus improving the speed of the overall phase calibration process.

Figure 4:
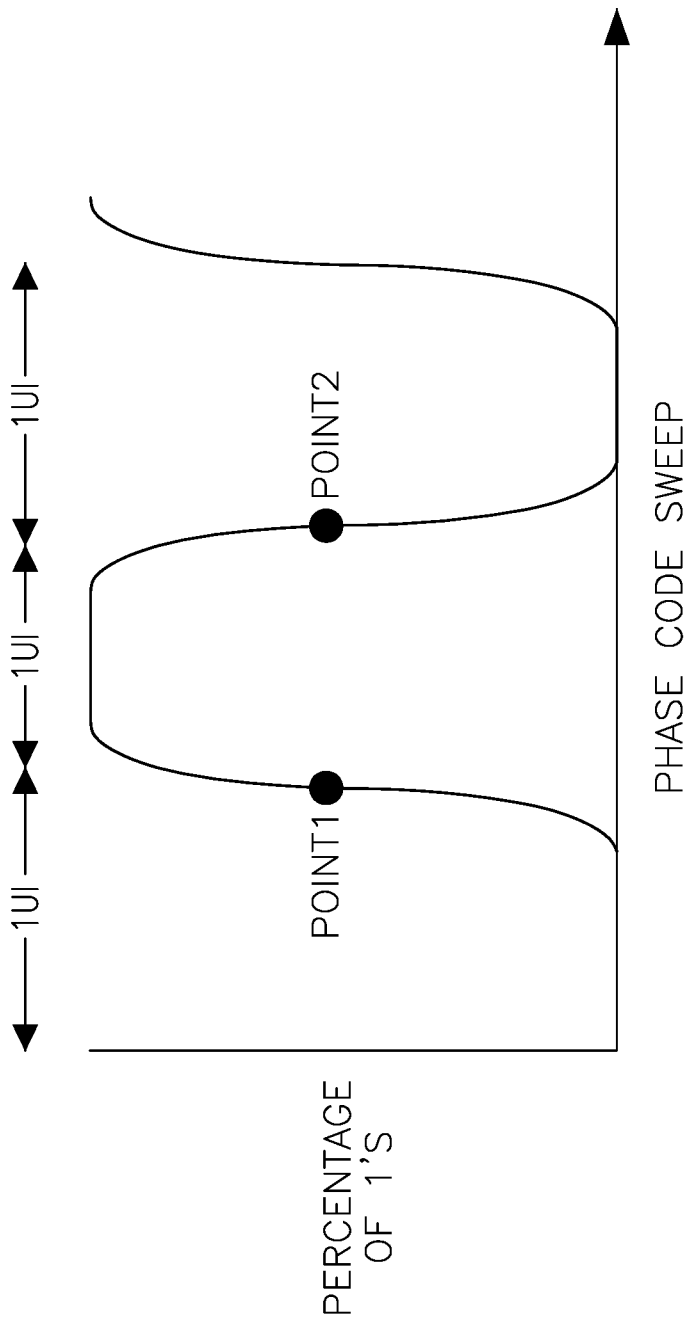
FIG. 4 is a graph of a phase code sweep illustrating a percentage of ones of extracted bits of data, according to an embodiment.

FIG. 4 is a graph representing a percentage of bits of data that are ones that are sampled early ("early bits") by the clock signal for each phase code during a phase code sweep. For example, a phase code that is represented by 8-bits has 256 different phase codes that causes the clocks signal to shift by 256 different increments, and the percentage of ones obtained as a result of each of the 256 different clock phases may be plotted in the graph to generate a graph of phase code vs. percentage of ones, as illustrated in FIG. 4. That is, for each phase code out of the plurality of phase codes that are swept, the percentage of bits that are ones are plotted in this graph. The lower regions of the graph correspond to phase codes where substantially none (e.g., 0-5%) of the extracted data bits from the phase code sweep are ones. In other words, almost all of the extracted data bits (e.g., 95-100%) are sampled later ("late bits") by the clock signal. On the other hand, the upper regions of the graph correspond to phase codes where substantially all (e.g., 95-100%) of the extracted data bits from the phase code sweep are ones. The middle regions of the graph correspond to phase codes where the about half of the extracted bits are ones and about half of the extracted bits are zeros. Accordingly, this 50% threshold corresponds to when the edges of the serial clock signal align with the edges of the serial data signal. Therefore, by determining the phase codes that correspond to the 50% threshold, the clock signal may be adjusted by shifting the clock signal away from the 50% threshold point so that the edges of the clock signal aligns with the middle of the data eye.

Figure 5:
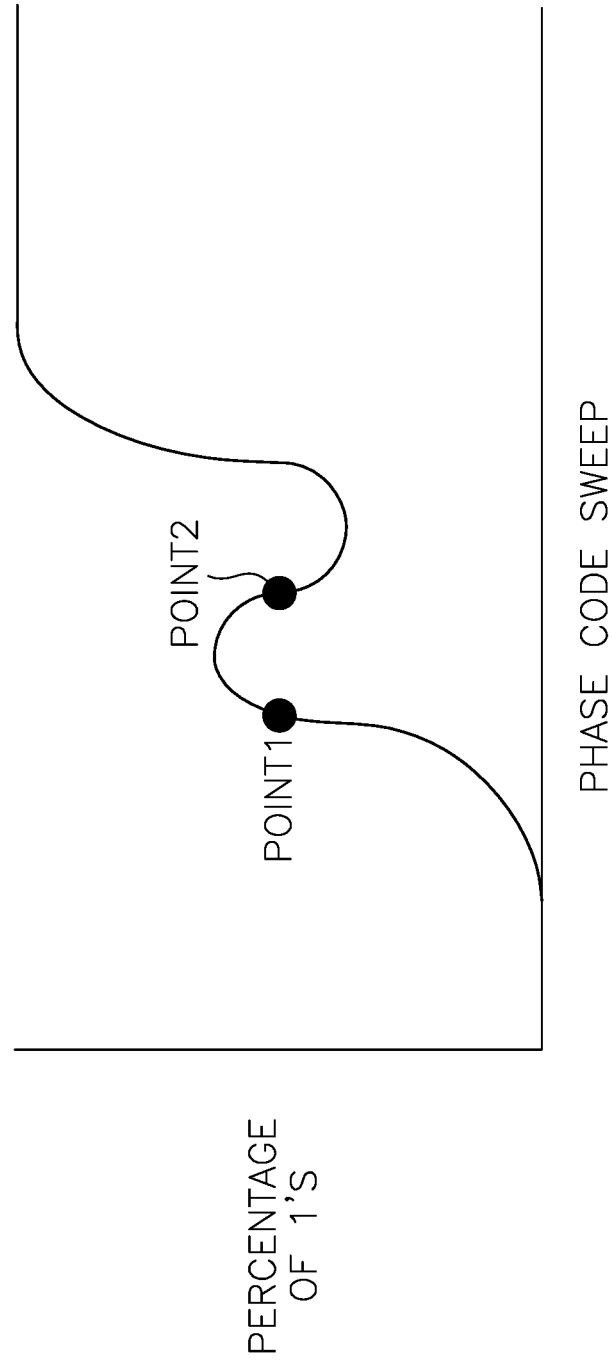
FIG. 5 is a graph of a phase code sweep illustrating a percentage of ones of extracted bits of data with errors resulting from a jittery clock, according to an embodiment.

According to an embodiment, the phase codes corresponding to POINT1 and POINT2 in FIG. 4 may be saved and averaged, to determine the average phase code, which may then be applied to the clock signal to align the edges of the clock signal with the middle of the data eye of the data signal. In other words, as the phase code is swept, a plurality (e.g., 64, 128, 256, etc.) different phase adjusted clock signals are generated by the interpolator 116, and when the percentage of ones increase from about zero to about 50% (i.e, about 50% of the bits are early and about 50% of the bits are not early), then the corresponding phase code may be saved as POINT1. The phase code may then continue to sweep and the percentage of ones will increase to about 100% and then begin to decrease again. When the percentage of ones decrease to about 50% again, then the corresponding phase code can be saved as POINT2. However, this technique of setting the phase code may be relatively slow and prone to errors. For example, when the edges of the clock signal and the edge of the data are aligned, the data samples may become jittery, thus resulting in false detection of the phase code as shown with the graph as illustrated in FIG. 5 where the average of POINT1 and POINT2 do not necessarily reflect a phase code corresponding to 50% ones.

Figure 6:
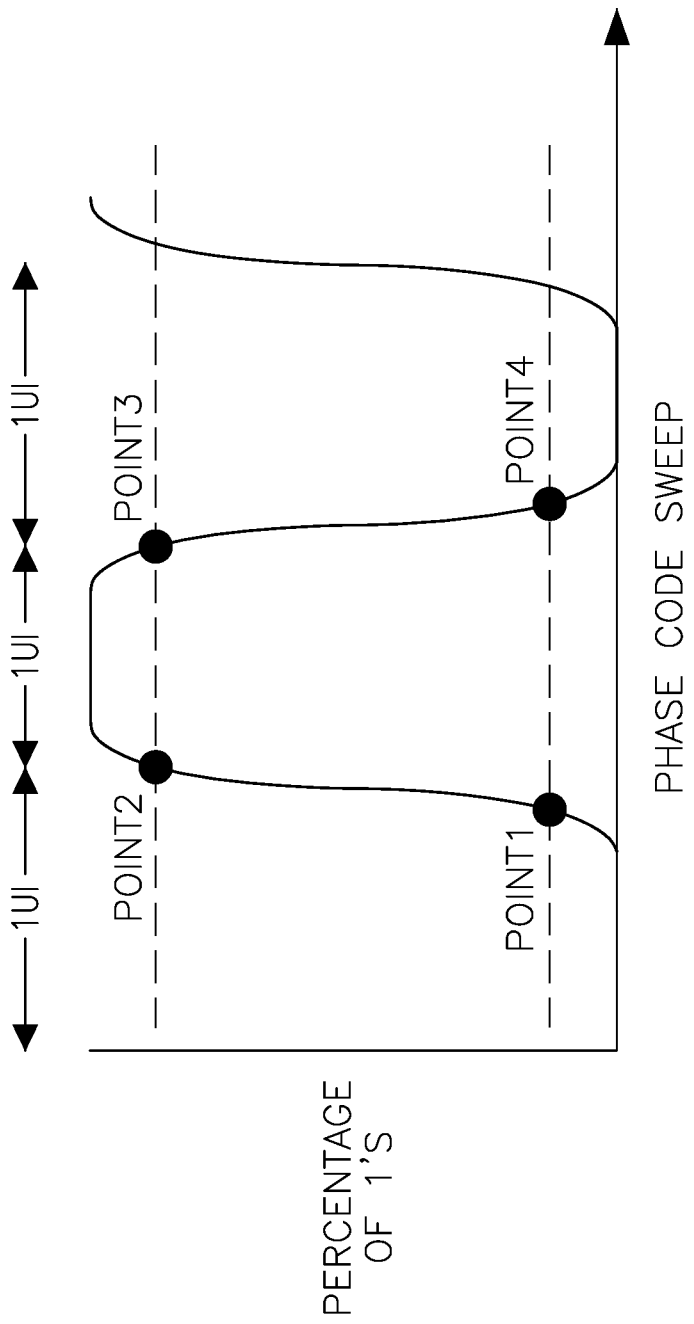
FIG. 6 is a graph of a phase code sweep illustrating a percentage of ones of extracted bits of data, according to an embodiment.

FIG. 6, like FIG. 4, is a graph that represents a percentage of ones during a phase code sweep. Differently from FIG. 4, however, FIG. 6 illustrates a 4-point detection technique for determining the correct phase code by saving different POINTS of the phase code sweep graph to avoid or reduce errors that may result due to jitters. Accordingly, a more accurate phase code may be determined.

According to the embodiment, a plurality of phase codes may be swept to determine the percentage of ones. For example, the phase codes may be made up of any number of bits, for example, 8-bits comprising 256 different phase codes that are applied to the phase interpolator to generate 256 different phase adjusted clock signals, which are used to sample the data signal and the percentage of ones is determined from the sampled bits. In order to determine which phase codes generate about 50% ones and 50% zeros, two phase codes that correspond to substantially no ones (e.g., no ones plus some threshold such as about 0-5% ones) are saved, and two phase codes that correspond to substantially all ones (e.g., all ones plus some threshold such as amount 95-100% ones) are saved.

More particularly, as the phase code sweep is performed, as the percentage of the ones increases from zero to near-zero (e.g., about 5%), that corresponding phase code is saved as POINT1 as illustrated in FIG. 6. As the phase code sweep continues, the percentage of ones increases toward 100%. The phase code corresponding to near-100% (e.g., about 95%) to 100% is saved as POINT2 as illustrated in FIG. 6. In some embodiments, the phase code sweep continues and eventually, the percentage of ones begin to decrease again. Here, as the percentage of ones begin to decrease from 100% to near-100% (e.g., about 95%), that corresponding phase code is saved as POINT3 as illustrated in FIG. 6. Finally, the phase code sweep continues to decrease and the phase code corresponding to near-zero (e.g., about 5%) to zero is saved as POINT4.

In some embodiments, the average of these four phase codes, POINT1, POINT2, POINT3, and POINT4 may be computed to determine a final phase codes that corresponds to about 50% ones. That is, for example, if there are 256 phase codes and if phase codes corresponding to POINTS1, 2, 3, 4 are 40, 60, 200, 215, respectively, then the average phase code is (40+50+200+215)/4=126.25. According to an embodiment, once the phase codes that correspond to the 50% ones is computed through the averaging of the four saved POINTS, the final averaged phase code is applied to the phase interpolator 116 to adjust the clock phase so that the edges of the clock signal aligns with the middle of the data eye of the data signal. Additionally, phase codes are circular, and therefore "wrap around." For example, for phase codes that range from 0 to 255, and the phase codes corresponding to POINTS1, 2, 3, 4 are 190, 192, 64, 66, respectively, then the "circular" average is (190+192+(64+256)+(66+256))/4=256=0.

Figure 7:
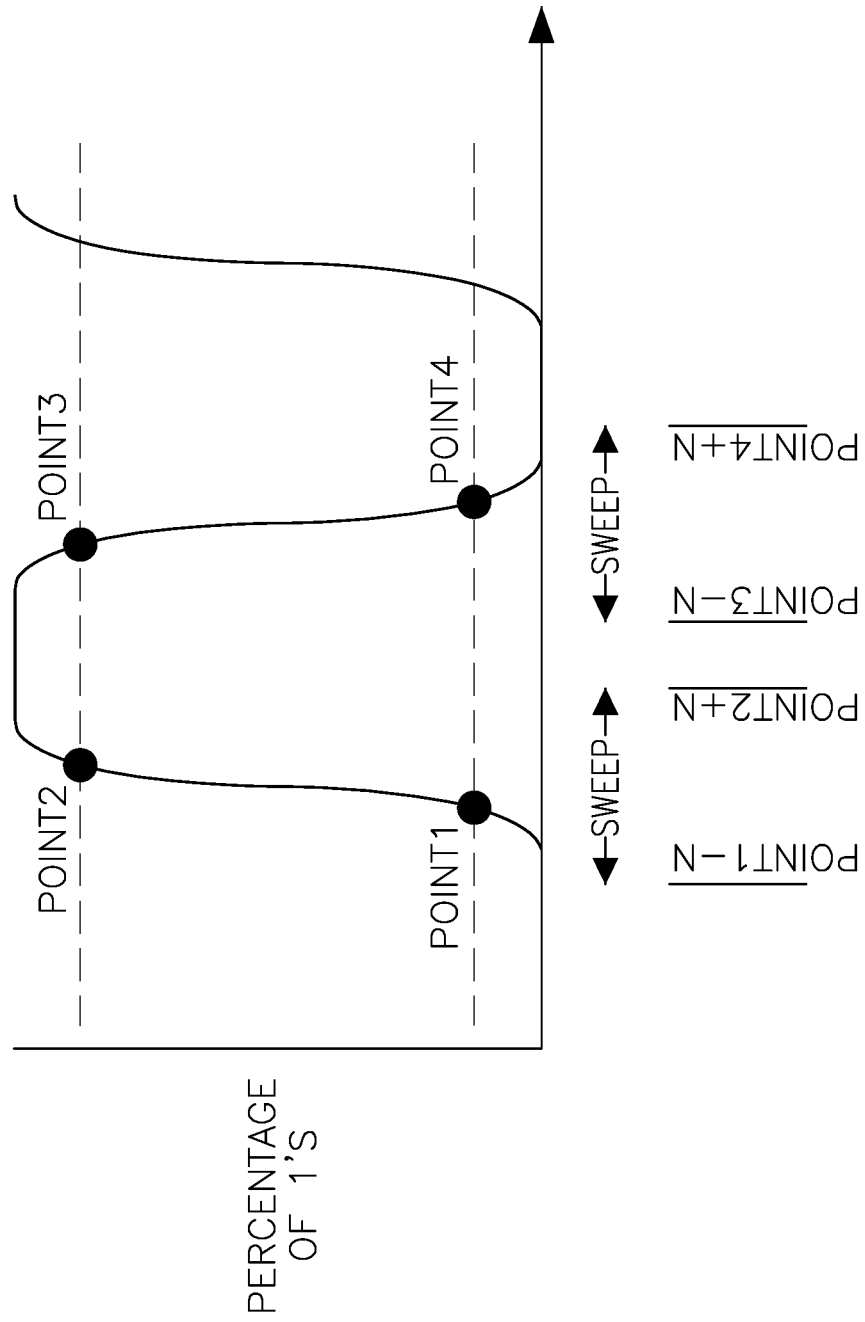
FIG. 7 is a graph of a phase code sweep illustrating a percentage of ones of extracted bits of data, according to another embodiment.

According to another embodiment of the present disclosure, a fast calibration technique is described. The fast calibration technique may be initiated after an initial execution of the 4-point detection technique. For example, the fast calibration technique may be used to perform phase calibration on the system periodically during use or during pauses between operations. FIG. 7 is a graph of a phase code sweep vs. the percentage of ones according to the fast calibration technique. Differently from the 4-point detection technique described above with reference to FIG. 6, the fast calibration technique performs phase code sweeps in smaller ranges, for example, by performing a first window of phase code sweep over a smaller range of phase codes, and then performing second window of phase code sweep over another smaller range of phase codes to reduce the amount of time spent sweeping the phase codes.

In some embodiments, the first window of phase code sweep may begin at N phase codes before the POINT1 and end at N phase codes after POINT2, where N corresponds to a predetermined or programmable constant value. In other words, similar to FIG. 6, POINT1 in FIG. 7 may be a phase code that corresponds to zero to substantially zero (e.g., about 5%) ones and POINT2 may be a phase code that corresponds to substantially all (e.g., about 95%) or all ones and the phase code sweep starts at N phase codes before this POINT1 (i.e., POINT1–N) and ends at N phase codes after POINT2 (i.e., POINT2+N). Accordingly, the first window of phase code sweep is substantially less than a full phase code sweep as described with reference to FIG. 6.

According to one example, N may be selected to be a value of 4 (out of 256 phase codes). Thus, the first window of the phase code sweep will start at 4 phase codes before POINT1 and end at 4 phase codes after POINT2. Accordingly, the programmable N values allow an end user to vary a trade-off between speed of calibration and phase-drift tolerance. That is, a larger N value may take a longer time to perform the sweep, thus resulting in a slower calibration, but will be able to tolerate a larger phase code drift by up to N-codes from the last calibration. On the other hand, a smaller N value may take less time to perform the sweep, thus resulting in a faster calibration, but will be able to tolerate smaller phase code drifts.

In some embodiments, the second window of phase code sweep may begin at N phase codes before POINT3 and end at N phase codes after POINT4. In other words, similar to FIG. 6, POINT3 may be a phase code that corresponds to substantially all (e.g., about 95%) to all ones and POINT4 may be a phase code that corresponds to zero to substantially zero (e.g., about 5%) ones and the phase code sweep starts at N phase codes before this POINT3 (i.e., POINT3–N) and ends at N phase codes after POINT4 (i.e., POINT4+N). Accordingly, the second window of phase code sweep is substantially less than a full phase code sweep as described with reference to FIG. 6. In other words, the first window of phase codes and the second window of phase code are swept, but the phase codes between POINT2+N and POINT3–N are not swept. Also, the phase codes before POINT1–N and the phase codes after POINT4+N are not swept. Therefore, the amount of time spent in sweeping the phase codes may be reduced, being able to obtain POINT1, POINT2, POINT3, and POINT4 much faster.

Next, the average phase codes of POINT1, POINT2, POINT3, and POINT4 may be computed to determine a final phase codes that corresponds to about 50% ones. According to an embodiment, once the phase codes that correspond to the 50% ones is computed through the averaging of the four saved POINTS, the final averaged phase code is applied to the phase interpolator 116 to adjust the clock phase so that the edges of the clock signal aligns with the middle of the data eye. Thus, similar results to the method described with reference to FIG. 6 may be achieved much faster according to this this technique by utilizing the phase code information obtained earlier. That is, for example, the phase code corresponding to POINT1 from a previous calibration cycle may be used to obtain POINT1–N, and start the phase code sweep at POINT1–N and skipping the region before POINT1–N. Similarly, the region between POINT2+N and POINT3–N may be skipped before the phase code corresponding to POINT3 is already known from a previous calibration cycle and therefore the second window of phase code sweep may be started at POINT3–N.

FIG. 8 is a flow chart of the 4-point detection technique and the fast calibration technique. According to an embodiment, a phase calibration request is received by the phase calibrator 114 to calibrate the serial clock signal with the serial data signal. During initial calibration, an initial calibration method (804) using the 4-point detection technique may be executed. Alternatively, during periodic calibration, a periodic calibration method (816) using the fast mode calibration technique may be executed. In some embodiments, the initial calibration method (804) may be executed even when a periodic calibration is desired, however, the initial calibration method may take longer to execute than the periodic calibration method.

Once the initial calibration mode is selected, the phase code sweeping process may begin. As previously discussed, the phase code sweep may include any number of different phase codes, for example 256 phase codes wherein each one corresponds to a clock signal that is shifted slightly (e.g., $\frac{1}{256}$th of a clock cycle). According to an embodiment, the phase code is first set to 0 (806), which corresponds to the first phase code out of a plurality of phase codes that will be used during a phase code sweep (e.g., 1st phase code out of 0 to 255 phase codes). In some embodiments, the phase code may be a 6-bit phase code comprising 64 phase codes for a phase code sweep. Yet in other embodiments, the phase code may be an 7-bit phase code comprising 128 phase codes for a phase code sweep. For purposes of providing an example in this disclosure, the phase code is assumed to be 8-bits by way of example only.

Next, the phase code is swept by applying a plurality of phase codes to the phase interpolator (808). As the phase code sweep is executed, the phase of the clock is adjusted and the percentage of ones may be determined from the sampled and deserialized data, varying from no ones to all ones. When 0 to nearly 0% (e.g., about 5%) of the bits are ones, the corresponding phase code is saved as POINT1, as described with reference to FIG. 6 (810). According to an embodiment, the phase code sweep is performed for three unit intervals (UIs) (e.g., duration of one bit of serial clock) to capture POINT1, POINT2, POINT3, and POINT4 as described with reference to FIG. 6. For example, POINT2 is saved when the percentage of ones is nearly 100% (e.g., about 95%) to 100%, POINT3 is saved when the percentage of ones is nearly 100% (e.g., about 95%) to 100%, and POINT4 is saved when the percentage of ones is nearly 0% (e.g., about 5%) to 0%. Once the four POINTS are saved (812), a final phase code is calculated by averaging the phase codes corresponding to POINT1–POINT4 (838), and the calculated phase code is applied to the phase interpolator 116 (840). If the phase code sweep has not been performed for three UIs (812), then the phase code will be incremented to the next phase code, e.g., from phase code 1 to phase code 2, and so on, and then steps 808-812 will be repeated until three UIs have been swept and the four POINTS have been saved.

In some embodiments, the periodic calibration method using the fast calibration technique may be executed (816). First, the phase code is set to POINT1–N (818), where N is a predetermined or a programmable constant. The phase code for POINT1 may be determined from a previous phase code sweep, for example, from the initial calibration mode. Next, a first window of phase codes are swept by applying a plurality of phase codes to the phase interpolator (820). As the first window phase code sweep is executed, the phase of the clock is adjusted and the percentage of ones may be determined from the sampled and deserialized data, varying from no ones to all ones. When 0 to near-0% (e.g., about 5%) of the bits are ones, the corresponding phase code is saved as POINT1, as described with reference to FIG. 7 (822). The first window phase code sweep is continued and when the phase code is equal to POINT2+N, the first window of phase code sweep has been executed for the first two POINTS (824). If the phase code does not equal to POINT2+N, then the phase code is incremented and steps 820-824 are repeated until both POINT1 and POINT2 are saved (826). Then, once POINT1 and POINT2 are saved, then the phase code is set to POINT3–N (828), and a phase code sweep of the second window is executed and applied to the phase interpolator (830). When the percentage of ones is nearly 100% (e.g., about 95%) to 100% of ones is determined, the corresponding phase code is saved as POINT3, as described with reference to FIG. 7 (832), and checked to see if the phase code is equal to POINT4+N, which indicates that the phase code sweep has been executed for the third and fourth POINTS (834). If the phase code does not equal POINT4+N, then the phase code is incremented (836) and steps 830-834 are repeated until both POINT3 and POINT4 are saved (836). Once both POINT3 and POINT4 are saved, a final phase code may be calculated by averaging the phase codes corresponding to POINT1, POINT2, POINT3, and POINT4 (838), and the calculated phase code is applied to the phase interpolator (840). Once the calibration cycle is completed, the phase calibrator enters an idle state and waits until another calibration request is received (842).

According to an embodiment, once the phase interpolator 116 is updated with the calculated final phase code, the phase interpolator 116 may adjust the clock signal and provide the now calibrated clock signal to the slicer 118, which will then use this calibrated clock signal to sample incoming serial data. Accordingly, the edges of the calibrated clock signal now align with the middle of the data eye of the incoming serial data signal.

While the above described techniques refer to percentage of ones (e.g., bits that are early), in other embodiments, the bits may instead be zeros (e.g., bits that are late). Thus, 4-point detection technique or the fast calibration technique may utilize the percentage of zeros instead of the percentage of ones by applying the same techniques.

In some embodiments, multiple calibration techniques may be performed together to achieve improved calibration results. For example, the 4-point detection technique described above with reference to FIG. 6 may be applied together with the two-edge sampling technique described above with reference to FIGS. 3A-3B where the data is sampled at both the rising edge and the falling edges of the clock signal. Yet, in other embodiments, the fast calibration technique described above with reference to FIG. 7 may be applied together with the two-edge sampling technique described above with reference to FIGS. 3A-3B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively.

The electronic or electric devices and/or any other relevant devices or components according to embodiments of the present invention described herein may be implemented utilizing any suitable hardware, firmware (e.g. an application-specific integrated circuit, or a field-programmable gate array), software, or a combination of software, firmware, and/or hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random-access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the example embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Embodiments described herein are examples only. One skilled in the art may recognize various alternative embodiments from those specifically disclosed. Those alternative embodiments are also intended to be within the scope of this disclosure. As such, the embodiments are limited only by the following claims and their equivalents.

What is claimed is:

1. A phase calibration method, comprising:
   receiving a serial clock signal;
   receiving a serial data signal;
   sweeping a plurality of phase codes applicable to the serial clock signal to shift a phase of the serial clock signal;
   identifying a first phase code out of the plurality of phase codes, wherein the first phase code causes zero plus a first threshold number of bits extracted from the serial data signal to be a particular value;
   identifying a second phase code out of the plurality of phase codes, wherein the second phase code causes all minus a second threshold number of bits extracted from the serial data signal to be the particular value;
   identifying a third phase code out of the plurality of phase codes, wherein the third phase code causes all minus a third threshold number of bits extracted from the serial data signal to be the particular value;
   identifying a fourth phase code out of the plurality of phase codes, wherein the fourth phase code causes zero plus a fourth threshold number of bits extracted from the serial data signal to be the particular value;

determining an average phase code based on the first phase code, the second phase code, the third phase code, and the fourth phase code; and applying the average phase code to a phase interpolator to shift the phase of the serial clock signal.

2. The method of claim 1, wherein the serial data signal comprises a training pattern that is the same as the serial clock signal, and wherein each of the first, second, third, and fourth threshold number of bits correspond to about 0% to about 5% of total bits extracted.

3. The method of claim 2, wherein the particular value comprises ones or zeros, wherein the ones comprise bits that are extracted from the serial data signal at points that are earlier than intended, and wherein the zeros comprise bits that are extracted from the serial data signal at points that are later than intended.

4. The method of claim 1, wherein the sweeping the plurality of phase codes comprises sweeping three unit intervals of the serial data signal.

5. The method of claim 1, wherein the applying the average phase code to the phase interpolator to shift the phase of the serial clock signal comprises shifting the serial clock signal such that an edge of the serial clock signal is aligned with middle of data eye of the serial data signal.

6. The method of claim 1, wherein the extracted bits from the serial data signal comprise a first bit corresponding to a rising edge of the serial clock signal and a second bit corresponding to a falling edge of the serial clock signal.

7. The method of claim 1, further comprising:

sweeping a first window of phase codes to identify an updated first phase code and an updated second phase code, wherein the first window begins at the first phase code minus a constant and ends at the second phase code plus the constant;

sweeping a second windows of phase codes to identify an updated third phase code and an updated fourth phase code, wherein the second windows begins at the third phase code minus the constant and ends at the fourth phase code plus the constant;

determining an updated average phase code based on the updated first phase code, the updated second phase code, the updated third phase code, and the updated fourth phase code; and applying the updated average phase code to the phase interpolator to further shift the serial clock signal.

8. The method of claim 7, wherein the constant is a predetermined value that is programmable.

9. The method of claim 8, wherein the updated first phase code is different from the updated second phase code, and the updated third phase code is different from the updated fourth phase code.

10. A system comprising:

a memory storing computer-executable instructions; and a processor configured to execute the instructions and causes the system to perform operations comprising:

receiving a serial clock signal;

receiving a serial data signal;

sweeping a plurality of phase codes applicable to the serial clock signal to shift a phase of the serial clock signal;

identifying a first phase code out of the plurality of phase codes, wherein the first phase code causes zero plus a first threshold number of bits extracted from the serial data signal to be a particular value;

identifying a second phase code out of the plurality of phase codes, wherein the second phase code causes all minus a second threshold number of bits extracted from the serial data signal to be the particular value;

identifying a third phase code out of the plurality of phase codes, wherein the third phase code causes all minus a third threshold number of bits extracted from the serial data signal to be the particular value;

identifying a fourth phase code out of the plurality of phase codes, wherein the fourth phase code causes zero plus a first threshold number of bits extracted from the serial data signal to be the particular value;

determining an average phase code based on the first phase code, the second phase code, the third phase code, and the fourth phase code; and applying the average phase code to a phase interpolator to shift the phase of the serial clock signal.

11. The system of claim 10, wherein the serial data signal comprises a training pattern that is the same as the serial clock signal, and wherein each of the first, second, third, and fourth threshold number of bits correspond to about 0% to about 5% of total bits extracted.

12. The system of claim 11, wherein the particular value comprises ones or zeros, wherein the ones comprise bits that are extracted from the serial data signal at points that are earlier than intended, and wherein the zeros comprise bits that are extracted from the serial data signal at points that are later than intended.

13. The system of claim 10, wherein the sweeping the plurality of phase codes comprises sweeping three unit intervals of the serial data signal.

14. The system of claim 10, wherein the applying the average phase code to the phase interpolator to shift the phase of the serial clock signal comprises shifting the serial clock signal such that an edge of the serial clock signal is aligned with middle of data eye of the serial data signal.

15. The system of claim 10, wherein the extracted bits from the serial data signal comprise a first bit corresponding to a rising edge of the serial clock signal and a second bit corresponding to a falling edge of the serial clock signal.

16. The system of claim 10, wherein the instructions further causes the system to perform operations comprising:

sweeping a first window of phase codes to identify an updated first phase code and an updated second phase code, wherein the first window begins at the first phase code minus a constant and ends at the second phase code plus the constant;

sweeping a second windows of phase codes to identify an updated third phase code and an updated fourth phase code, wherein the second windows begins at the third phase code minus the constant and ends at the fourth phase code plus the constant;

determining an updated average phase code based on the updated first phase code, the updated second phase code, the updated third phase code, and the updated fourth phase code; and applying the updated average phase code to the phase interpolator to further shift the serial clock signal.

17. The system of claim 16, wherein the constant is a predetermined value that is programmable.

18. The system of claim 17, wherein the updated first phase code is different from the updated second phase code, and the updated third phase code is different from the updated fourth phase code.

19. A phase calibration method, comprising:
receiving a serial clock signal;
receiving a serial data signal;
sweeping a first window of phase codes, applicable to the serial clock signal to shift a phase of the serial clock signal, to identify an updated first phase code and an updated second phase code, wherein the first window begins at a predetermined first phase code minus a constant and ends at a predetermined second phase code plus the constant;
identifying the updated first phase code, wherein the updated first phase code causes zero plus a first threshold number of bits extracted from the serial data signal to be a particular value;
identifying the updated second phase code, wherein the updated second phase code causes all minus a second threshold number of bits extracted from the serial data signal to be the particular value;
sweeping a second window of phase codes, applicable to the serial clock signal to shift the phase of the serial clock signal, to identify an updated third phase code and an updated fourth phase code, wherein the second window begins at a predetermined third phase code minus the constant and ends at a predetermined fourth phase code plus the constant;
identifying the updated third phase code, wherein the updated third phase code causes all minus a third threshold number of bits extracted from the serial data signal to be the particular value;
identifying the updated fourth phase code, wherein the updated fourth phase code causes zero plus a fourth threshold number of bits extracted from the serial data signal to be the particular value;
determining an average phase code based on the updated first phase code, the updated second phase code, the updated third phase code, and the updated fourth phase code; and
applying the average phase code to a phase interpolator to shift the phase of the serial clock signal.

20. The method of claim 19, wherein each of the first, second, third, and fourth threshold number of bits correspond to about 0% to about 5% of total bits extracted,
wherein the particular value comprises ones or zeros,
wherein the ones comprise bits that are extracted from the serial data signal at points that are earlier than intended, and
wherein the zeros comprise bits that are extracted from the serial data signal at points that are later than intended.

* * * * *